United States Patent
Chen et al.

(10) Patent No.: US 11,011,554 B2
(45) Date of Patent: May 18, 2021

(54) ARRAY SUBSTRATE, METHOD FOR FABRICATING THE SAME, AND DISPLAY PANEL

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Chuanbao Chen, Beijing (CN); Xiaobin Yin, Beijing (CN); Juncai Ma, Beijing (CN); Chaozhi Yu, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/331,826

(22) PCT Filed: Jun. 7, 2018

(86) PCT No.: PCT/CN2018/090241
§ 371 (c)(1),
(2) Date: Mar. 8, 2019

(87) PCT Pub. No.: WO2018/228265
PCT Pub. Date: Dec. 20, 2018

(65) Prior Publication Data
US 2019/0369785 A1    Dec. 5, 2019

(30) Foreign Application Priority Data

Jun. 14, 2017  (CN) .......................... 201710450197.2

(51) Int. Cl.
*G06F 3/041*    (2006.01)
*H01L 27/12*    (2006.01)
(Continued)

(52) U.S. Cl.
CPC ........ *H01L 27/1244* (2013.01); *G02F 1/1368* (2013.01); *G02F 1/13338* (2013.01);
(Continued)

(58) Field of Classification Search
CPC .... G06F 3/0412; G06F 3/0445; G06F 3/0446; G06F 2203/04103; G06F 2203/04105;
(Continued)

(56) References Cited

U.S. PATENT DOCUMENTS

2011/0102367 A1    5/2011  Wang et al.
2011/0228188 A1*   9/2011  Kim .................... G02F 1/13338
                                                        349/43
(Continued)

FOREIGN PATENT DOCUMENTS

CN    102830879 A    12/2012
CN    103092446 A    5/2013
(Continued)

OTHER PUBLICATIONS

Second Office Action and English language translation, CN Application No. 201710450197.2, dated Oct. 29, 2019, 14 pp.
(Continued)

*Primary Examiner* — Bryan Earles
(74) *Attorney, Agent, or Firm* — Myers Bigel, P.A.

(57) ABSTRACT

Embodiments of the present disclosure provide an array substrate, a method for fabricating the same, and a display panel. The array substrate comprises a substrate, first signal lines and touch electrode signal lines the substrate. The touch electrode signal lines intersect with the first signal lines. Each of the touch electrode signal lines includes a plurality of first sub-signal lines and a plurality of second sub-signal lines. The first sub-signal lines are arranged in a same layer as and insulated from the first signal line. Each of the second sub-signal lines run across one of the first
(Continued)

signal lines and are electrically connected with the first sub-signal lines adjacent to said second sub-signal line through vias. The first sub-signal lines are arranged in a layer different from the second sub-signal lines.

17 Claims, 5 Drawing Sheets

(51) Int. Cl.
*G02F 1/1333* (2006.01)
*G06F 3/044* (2006.01)
*G02F 1/1362* (2006.01)
*G02F 1/1368* (2006.01)

(52) U.S. Cl.
CPC ...... *G02F 1/136286* (2013.01); *G06F 3/0412* (2013.01); *G06F 3/0443* (2019.05); *G06F 3/0445* (2019.05); *G06F 3/0446* (2019.05); *G06F 3/04166* (2019.05); *H01L 27/1259* (2013.01); *G02F 1/136295* (2021.01); *G06F 2203/04103* (2013.01); *G06F 2203/04105* (2013.01)

(58) Field of Classification Search
CPC .... G06F 3/0443; G06F 3/0414; G06F 3/0416; G02F 1/13338; G02F 1/136286; G02F 1/1368; G02F 2001/136295; G02F 2001/134372; H01L 27/1244; H01L 27/1259
See application file for complete search history.

(56) References Cited

U.S. PATENT DOCUMENTS

| | | |
|---|---|---|
| 2014/0048854 A1 | 2/2014 | Wang et al. |
| 2015/0370396 A1* | 12/2015 | Hotelling ............. G06F 3/0414 345/174 |
| 2016/0188071 A1* | 6/2016 | Xu .......................... G06F 3/044 345/174 |
| 2016/0293630 A1* | 10/2016 | Ding .................. H01L 27/1259 |
| 2016/0328074 A1* | 11/2016 | Peng ...................... G06F 3/047 |
| 2017/0115768 A1* | 4/2017 | Shih ...................... G06F 3/0412 |
| 2017/0168617 A1 | 6/2017 | Qu |
| 2017/0235414 A1 | 8/2017 | Ding et al. |
| 2018/0196565 A1* | 7/2018 | Qu .................... G02F 1/134309 |
| 2018/0341353 A1* | 11/2018 | Zhang .................. G06F 3/0412 |

FOREIGN PATENT DOCUMENTS

| | | |
|---|---|---|
| CN | 104900658 A | 9/2015 |
| CN | 105068695 A | 11/2015 |
| CN | 107272952 A | 10/2017 |

OTHER PUBLICATIONS

International Search Report and Written Opinion of the International Searching Authority (with English language translation of Written Opinion), International Application No. PCT/CN2018/090241, dated Aug. 16, 2018, 11 pp.
First Office Action and English language translation, CN Application No. 201710450197.2, dated Mar. 5, 2019, 14 pp.

* cited by examiner

ARRAY SUBSTRATE, METHOD FOR FABRICATING THE SAME, AND DISPLAY PANEL

CROSS REFERENCE TO RELATED APPLICATIONS

The present application is a 35 U.S.C. 371 national stage application of PCT International Application No. PCT/CN2018/090241, filed on Jun. 7, 2018, which claims the benefit of Chinese Patent Application No. 201710450197.2, filed on Jun. 14, 2017, the contents of which are incorporated herein by reference in their entireties. The above-referenced International Application was published in the Chinese language as International Publication No. WO 2018/228265 A1 on Dec. 20, 2018.

TECHNICAL FIELD

The present disclosure relates to the field of display technology, in particular to an array substrate, a method for fabricating the same and a display panel.

BACKGROUND

With the rapid development of display technology, the birth of touch panel (TP) makes people's lives more convenient. At present, embedded capacitive touch technology has been widely used in the field of display technology.

To achieve the touch function, the touch electrode signal lines electrically connected with the touch electrodes must be arranged to input a touch signal to the touch electrodes through the touch electrode signal lines, or receive the sensing signal fed back by the touch electrodes. In the array substrate, the arrangement of the touch electrode signal lines and the data lines in a same layer may introduce defects or even failure.

SUMMARY

In a first aspect, an array substrate is provided. The array substrate comprises a substrate, first signal lines and touch electrode signal lines arranged on the substrate, the touch electrode signal lines are arranged to intersect with the first signal lines; each of the touch electrode signal lines comprises a plurality of first sub-signal lines and a plurality of second sub-signal lines; the first sub-signal lines are arranged in a same layer as and insulated from the first signal lines; each of the second sub-signal lines runs across one of the first signal lines and is electrically connected with the first sub-signal lines adjacent to said second sub-signal line through vias; the first sub-signal lines are arranged in a different layer from the second sub-signal lines.

In one or more embodiments, in an extending direction of the touch electrode signal lines, a distance between either end of an orthographic projection of each of the second sub-signal lines on the substrate and an orthographic projection of the first signal lines on the substrate is about 3-5 μm.

In one or more embodiments, the array substrate further comprises second signal lines; the second signal lines are arranged to intersect with the first signal lines and are insulated from the touch electrode signal lines.

In one or more embodiments, the second sub-signal lines of the touch electrode signal lines are arranged in a same layer as the second signal lines.

In one or more embodiments, one of the first signal lines and the second signal lines are gate lines, and the other are data lines.

In one or more embodiments, the first signal lines are gate lines and the second signal lines are data lines.

In one or more embodiments, the touch electrode signal lines are arranged in parallel with the second signal lines.

In one or more embodiments, the array substrate further comprises pixel electrodes, and the second sub-signal lines are arranged in a same layer as the pixel electrodes.

In one or more embodiments, the array substrate further comprises touch electrodes, and the touch electrodes are electrically connected with the touch electrode signal lines.

In one or more embodiments, the touch electrodes are multiplexed as common electrodes.

In a second aspect, a display panel is provided. The display panel comprises the array substrate of the first aspect.

In one or more embodiments, the display panel further comprises a pressure detecting structure, wherein the pressure detecting structure comprises a plurality of first pressure detecting electrodes and a plurality of second pressure detecting electrodes, the first pressure detecting electrodes are arranged on a substrate of a counter substrate to be assembled with the array substrate, and the second pressure detecting electrodes are arranged on the substrate of the array substrate.

In one or more embodiments, the second pressure detecting electrodes are arranged on a side of the pixel electrodes close to a backlight module and are insulated from the pixel electrodes.

In one or more embodiments, the second pressure detecting electrodes are arranged on a side of the touch electrodes close to the backlight module and are insulated from the touch electrodes.

In one or more embodiments, the touch electrodes are multiplexed as the second pressure detecting electrodes.

In a third aspect, a method for fabricating an array substrate is provided. The method comprises: forming first signal lines and touch electrode signal lines on a substrate, the touch electrode signal lines are arranged to intersect with the first signal lines; each of the touch electrode signal lines comprises a plurality of first sub-signal lines and a plurality of second sub-signal lines; the first sub-signal lines and the first signal lines are formed in a same patterning process and are insulated from the first signal lines; each of the second sub-signal lines runs across one of the first signal lines and is electrically connected with the first sub-signal lines adjacent to said second sub-signal line through vias; the second sub-signal lines are formed by a patterning process different from the first sub-signal lines.

In one or more embodiments, the method further comprises forming second signal lines; wherein the second signal lines are arranged to intersect with the first signal lines and are insulated from the touch electrode signal lines; the second sub-signal lines of the control electrode signal lines and the second signal lines are formed in a same patterning process.

In one or more embodiments, one of the first signal lines and the second signal lines are gate lines, and the other are data lines.

In one or more embodiments, the method further comprises forming pixel electrodes; wherein the second sub-signal lines are formed in a same patterning process as the pixel electrodes.

BRIEF DESCRIPTION OF THE DRAWINGS

In order to more clearly illustrate the technical solutions in embodiments of the disclosure, the appended drawings needed to be used in the description of the embodiments or the prior art will be briefly described below. Obviously, the drawings in the following description are only some embodiments of the disclosure, and for those of skilled in the art, other drawings may be obtained according to these drawings under the premise of not paying out creative work.

DETAILED DESCRIPTION

In the following, the technical solutions in the embodiments of the disclosure will be clearly and completely described in connection with the drawings in the embodiments of the disclosure. Obviously, the described embodiments are only part of the embodiments of the disclosure, rather than all embodiments. Based on the embodiments in the disclosure, all other embodiments obtained by those of skilled in the art without creative efforts are all within the protection scope of the disclosure.

A design of an array substrate in which touch electrode signal lines and data lines are arranged at intervals in a same layer suffers from drawbacks. Considering the aperture ratio, the touch electrode signal lines are not arranged in all sub-pixel regions, and the signal on the touch electrode signal lines has effect on the signal on the adjacent data lines, while the signals on other data lines are not affected. Thus the color ratio of the sub-pixels in the pixel is affected, thereby affecting the optical characteristics of the pixel. In addition, when the touch electrode signal lines are arranged in a same layer as the data lines, the introduction of foreign matter during the process is likely to cause a short circuit therebetween.

Embodiments of the present disclosure provide an array substrate, a method for fabricating the same, and a display panel to overcome or alleviate one or more of the above problems.

Figure 1:
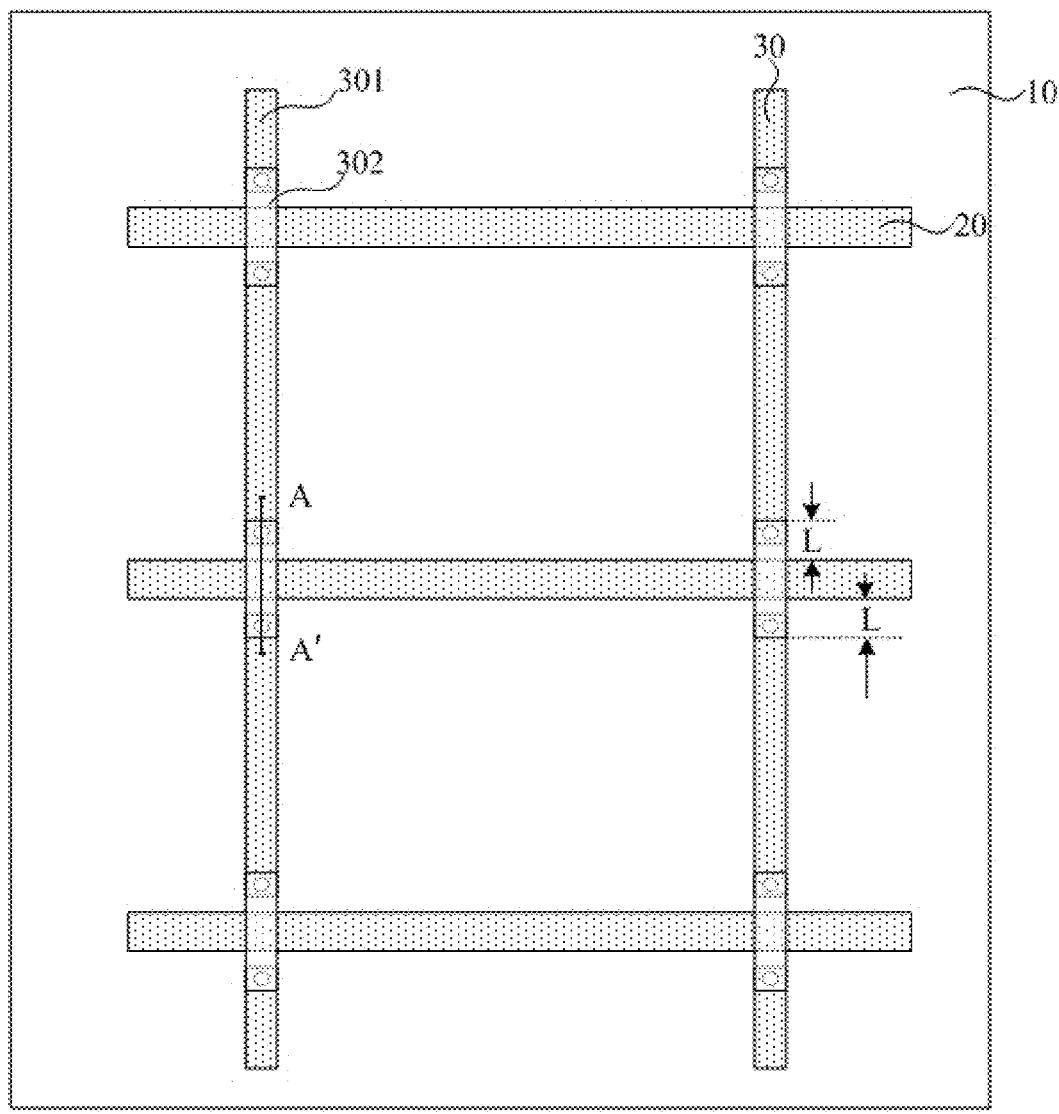
FIG. 1 is a schematic top view of an array substrate according to an embodiment of the present disclosure.
Figure 2:
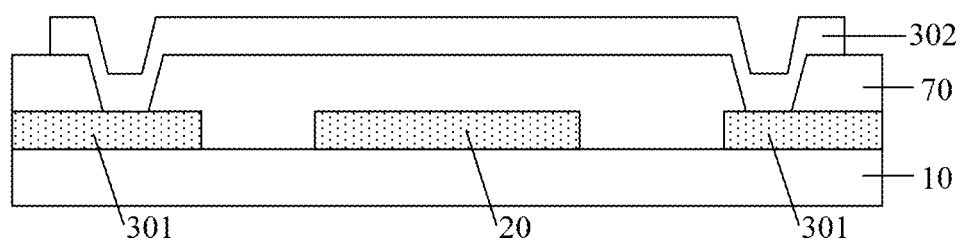
FIG. 2 is a cross-sectional view taken along the line AA' of FIG. 1.

An embodiment of the present disclosure provides an array substrate. As shown in FIG. 1 and FIG. 2, the array substrate comprises a substrate 10, first signal lines 20 and touch electrode signal lines 30 on the substrate 10. The touch electrode signal lines 30 are arranged to intersect with the first signal lines 20. Each of the touch electrode signal lines 30 comprises a plurality of first sub-signal lines 301 and a plurality of second sub-signal lines 302. The first sub-signal lines 301 are arranged in a same layer as the first signal lines 20 and are insulated from the first signal lines 20. Each of the second sub-signal lines 302 runs across one of the first signal lines 20 and is electrically connected with the first sub-signal lines 301 which is adjacent to said second sub-signal lines 302 through vias. The first sub-signal lines 301 are arranged in a different layer from the second sub-signal lines 302.

As shown in FIG. 2, the first sub-signal lines 301 and the first signal lines 20 are arranged in a same layer on the substrate 10, and arranged in a different layer from the second sub-signal lines 302. The insulating layer 70 covers the first sub-signal lines 301 and the first signal lines 20. The insulating layer 70 is provided with vias at each of the first sub-signal lines 301. The second sub-signal lines 302 electrically connect two of the first sub-signal lines 301 which are adjacent in an extending direction of the second sub-signal lines through the vias.

It should be understood by those skilled in the art that in case an array substrate is applied to a display device, the array substrate comprises at least two kinds of signal lines which intersect with one another, so as to display normally. That is, in addition to the first signal lines 20, the array substrate at least comprises second signal lines intersecting with the first signal lines 20.

Since the touch electrode signal lines 30 are arranged to intersect with the first signal lines 20, the touch electrode signal lines 30 are adjacent to the second signal lines which intersect with the first signal lines 20, without affecting the display.

Based on this, it will be understood by those skilled in the art hat the touch electrode signal lines 30, the first signal lines 20, and the second signal lines intersecting with the first signal lines 20 are used for different functions. Thus, these signal lines should be insulated from each other.

It should be noted that "A is arranged in a different layer from B" as used herein means that A is formed by a different patterning process from B.

The embodiment of the present disclosure provides an array substrate. By dividing the touch electrode signal lines 30 into a plurality of first sub-signal lines 301 and a plurality of second sub-signal lines 302, the first sub-signal lines 301 are arranged in a same layer as the first signal lines 20 and are insulated from the first signal lines 20, each of the second sub-signal lines 302 runs across one of the first signal lines 20 and is electrically connected with the first sub-signal lines 301 which is adjacent to said second sub-signal lines 302 through vias. Based on the design of the first sub-signal lines 301 of the touch electrode signal lines 30, even in case the second sub-signal lines 302 and the second signal lines intersecting with the first signal lines 20 are arranged in a same layer, the influence of the signal on the control electrode signal lines 30 on the second signal lines intersecting with the first signal lines 20 may be greatly reduced, and the risk of a short circuit between the touch electrode signal lines 30 and the second signal lines intersecting with the first signal lines 20 due to the introduction of foreign matter in the process may also be greatly reduced.

Considering the fact that the shorter the length of the second sub-signal lines 302 is, the more advantageous it is for reducing the influence on the second signal lines intersecting with the first signal lines 20 and the risk of short circuit, the length of the second sub-signal lines 302 spanning the first signal lines 20 is set in such a manner that electrical connection with the first sub-signal lines 301 is enabled while electrical connection with the first signal lines 20 is disabled.

Based on this, as shown in FIG. 1, a distance L represents a distance between either end of an orthographic projection of each of the second sub-signal lines 302 on the substrate 10 and an orthographic projection of the first signal lines 20 on the substrate 10 in the extending direction of the touch electrode signal lines 30. The distance L is set to be about 3-5 μm. For example, the distance L may be 3.5 μm, 4 μm, 4.5 μm, or the like.

Figure 3:
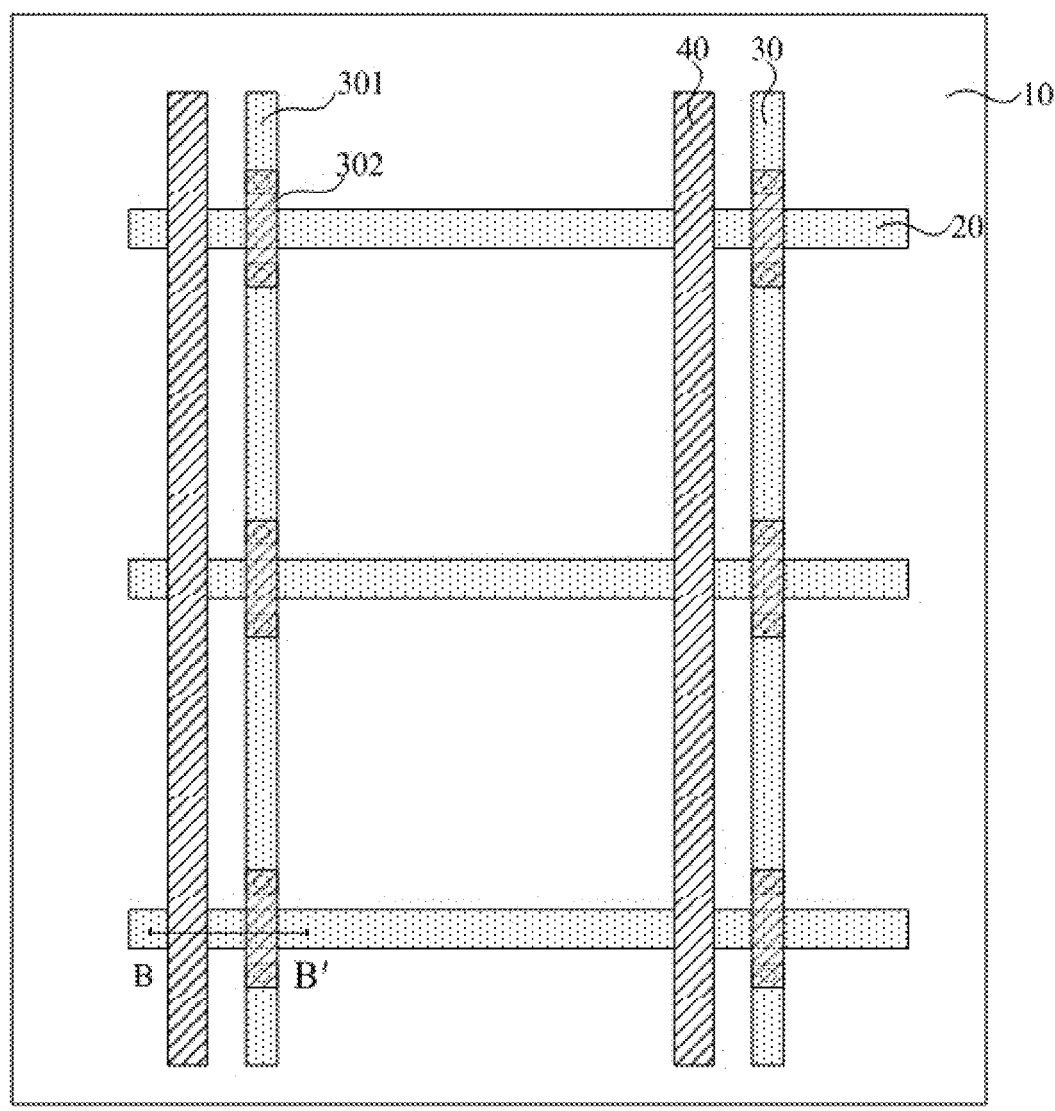
FIG. 3 is a schematic top view of an array substrate according to an embodiment of the present disclosure.
Figure 4:
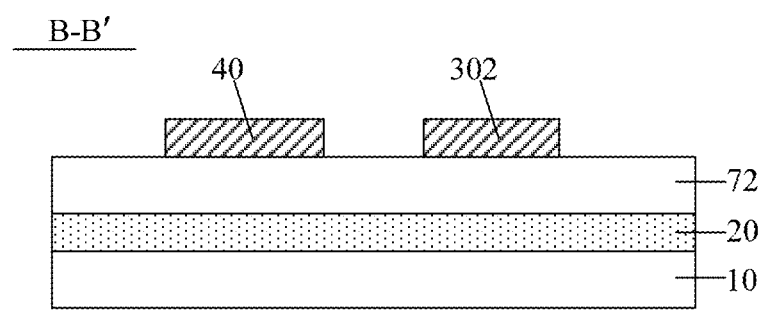
FIG. 4 is a cross-sectional view taken along the line BB' of FIG. 3.
Figure 5:
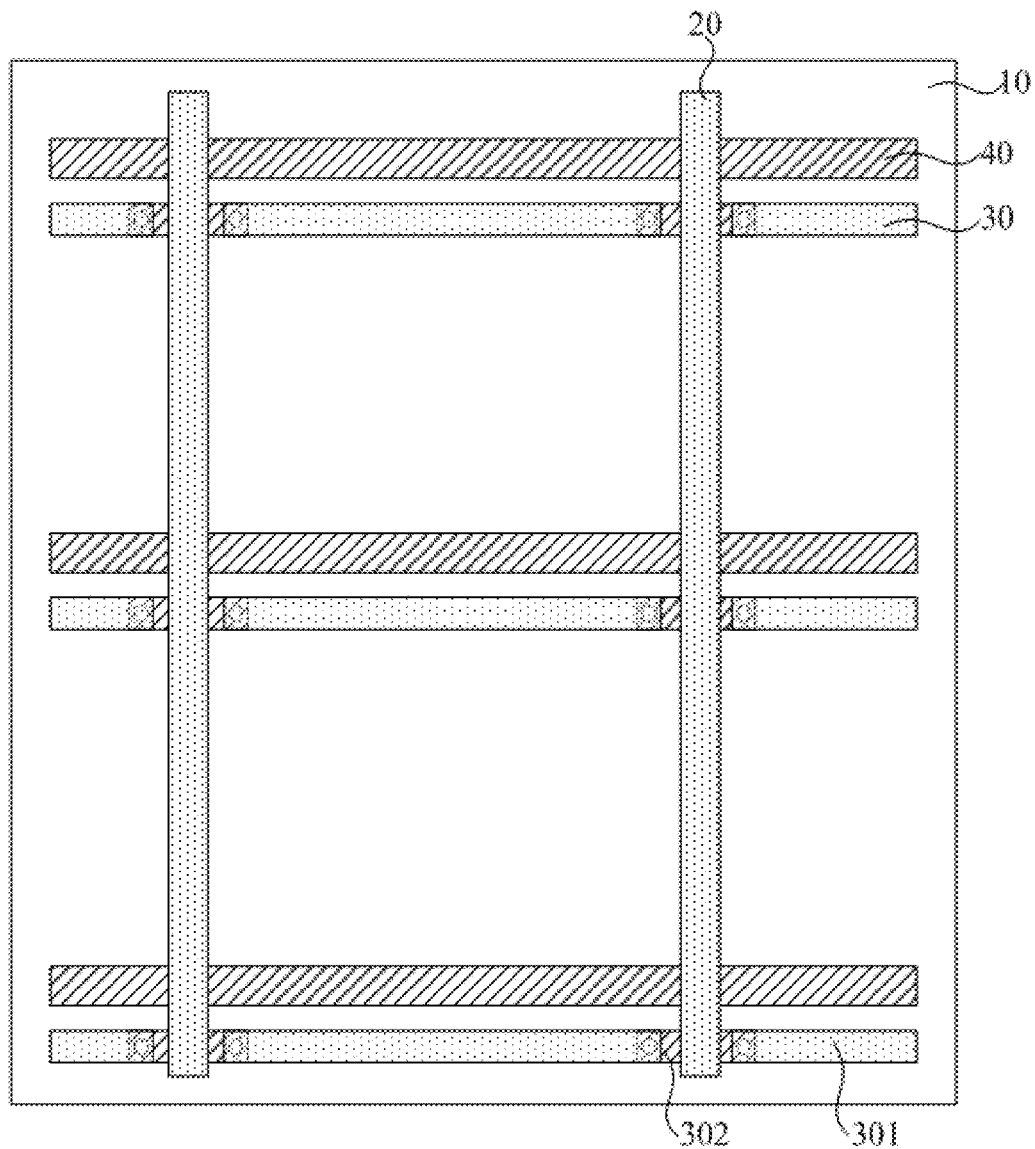
FIG. 5 is a schematic top view of an array substrate according to an embodiment of the present disclosure.

In one or more embodiments, as shown in FIGS. 3, 4 and 5, the second signal lines are arranged to intersect with the first signal lines 20, and are insulated from the touch electrode signal lines 30. The second sub-signal lines 302 of the touch electrode signal lines 30 are arranged in a same layer as the second signal lines 40.

As shown in FIG. 4, the second sub-signal lines 302 of the touch electrode signal lines 30 are arranged in a same layer as the second signal lines 40. That is, the second sub-signal lines 302 of the touch electrode signal lines 30 and the second signal lines 40 are formed in a same patterning process. The second sub-signal lines 302 and the second signal lines 40 are insulated from the first signal lines 20 by the insulating layer 72.

In order to minimize the influence on the aperture ratio and avoid the short circuit between the second signal lines 40 and the touch electrode signal lines 30, the distance between the second signal lines 40 and the touch electrode signal lines 30 may be set to be about 3-5 μm.

On one hand, by arranging the second sub-signal lines 302 of the touch electrode signal lines 30 and the second signal lines 40 in a same layer, the touch electrode signal lines 30 may be formed without any further patterning process, thereby saving cost. On the other hand, the signal lines are generally made of a low-resistance metal material to avoid large resistance which would affect the signal transmission quality. Therefore, since the second sub-signal lines 302 and the second signal lines 40 are arranged in a same layer, both the second sub-signal lines 302 and the first sub-signal lines 301 are made from a metal, it is ensured that the touch electrode signal lines 30 have low resistance.

In one or more embodiments, one of the first signal lines 20 and the second signal lines 40 are gate lines, and the other are data lines. For example, the first signal lines 20 are gate lines, and the second signal lines 40 are data lines (FIG. 3). In an alternative embodiment, the first signal lines 20 are data lines, and the second signal lines 40 are gate lines (FIG. 5). The second sub-signal lines 302 are electrically connected with the first sub-signal lines 301 through vias in the insulating layer between the gate lines and the data lines.

On this basis, considering that if the touch electrode signal lines 30 and the gate lines are arranged to intersect with one another, the subsequent binding of IC (integrated circuit), FPC (flexible printed circuit), and the like can be realized by a relatively mature process. Therefore, in one or more embodiments, the first signal lines 20 are gate lines, and the second signal lines 40 are data lines.

That is, the first sub-signal lines 301 are arranged in a same layer as the gate lines, and the second sub-signal lines 302 are arranged in a same layer as the data lines.

In one or more embodiments, the touch electrode signal lines 30 are arranged in parallel with the second signal lines 40. This simplifies the process of fabricating the touch electrode signal lines 30 and the second signal lines 40.

Figure 6:
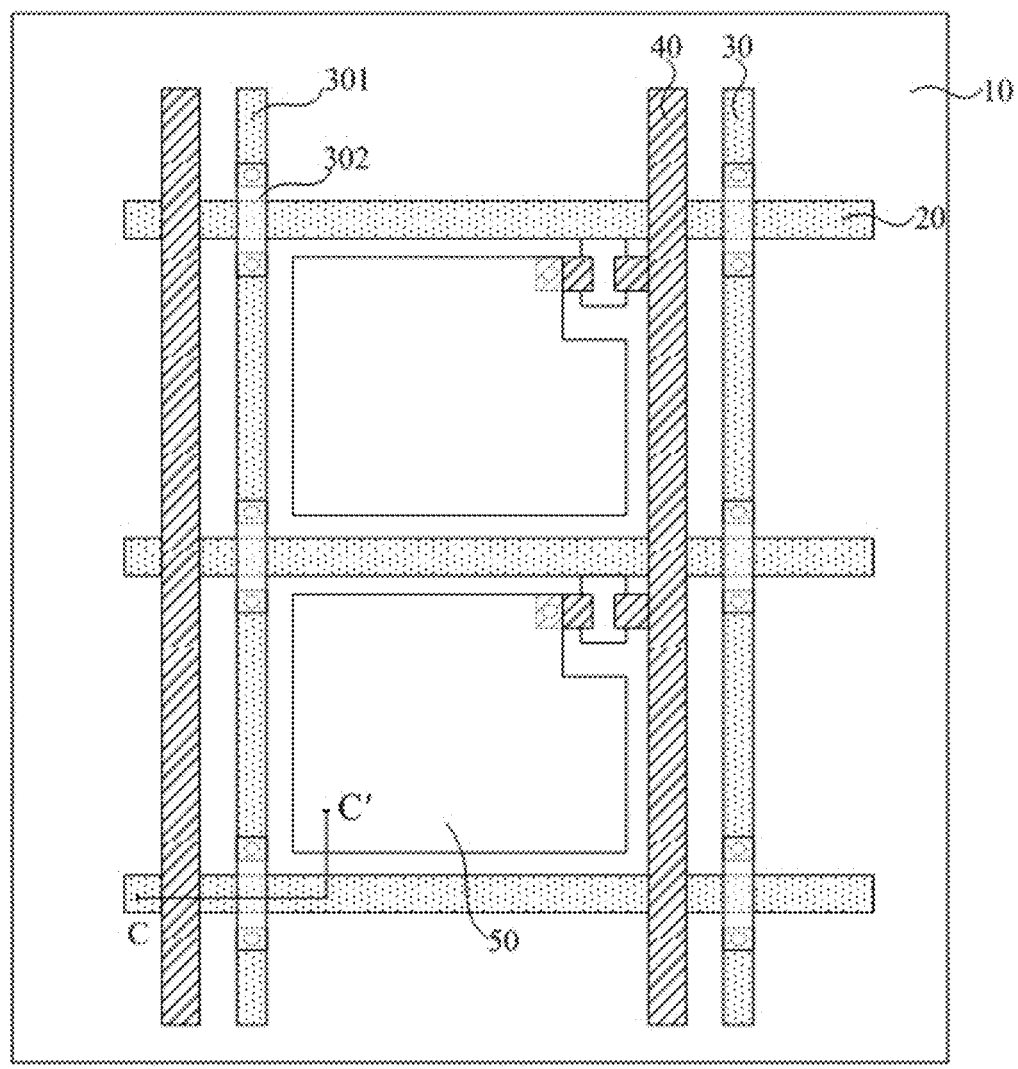
FIG. 6 is a schematic top view of an array substrate according to an embodiment of the present disclosure.
Figure 7:
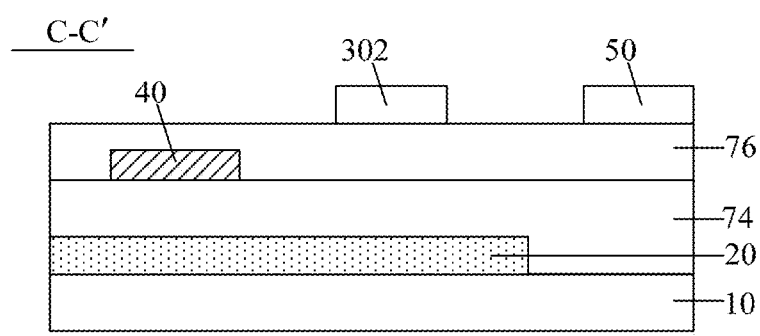
FIG. 7 is a cross-sectional view taken along the line CC' of FIG. 6.

In one or more embodiments, as shown in FIGS. 6 and 7, the array substrate further comprises pixel electrodes 50, and the second sub-signal lines 302 are arranged in a same layer as the pixel electrodes 50. The second signal lines 40 are insulated from the first signal lines 20 by the insulating layer 74. The second sub-signal lines 302 and the pixel electrodes 50 are insulated from the second signal lines 40 by the insulating layer 76.

In contrast with the first sub-signal lines 301 and the second sub-signal lines 302 which are made from a metal, the second sub-signal lines 302 is made from a transparent conductive material. Since the second sub-signal lines 302 are short, the influence on overall resistance of the touch electrode signal lines 30 is small, and the transmission quality of the signal on the touch electrode signal lines 30 may be ensured. On this basis, since the second sub-signal lines 302 of the touch electrode signal lines 30 are arranged in a different layer from the second signal lines 40, the influence of the signal on the touch electrode signal lines 30 on the second signal lines 40 may be completely avoided, and the problem that the touch electrode signal lines 30 and the second signal lines 40 are short-circuited due to the introduction of foreign matter in the process is completely avoided.

Figure 8:
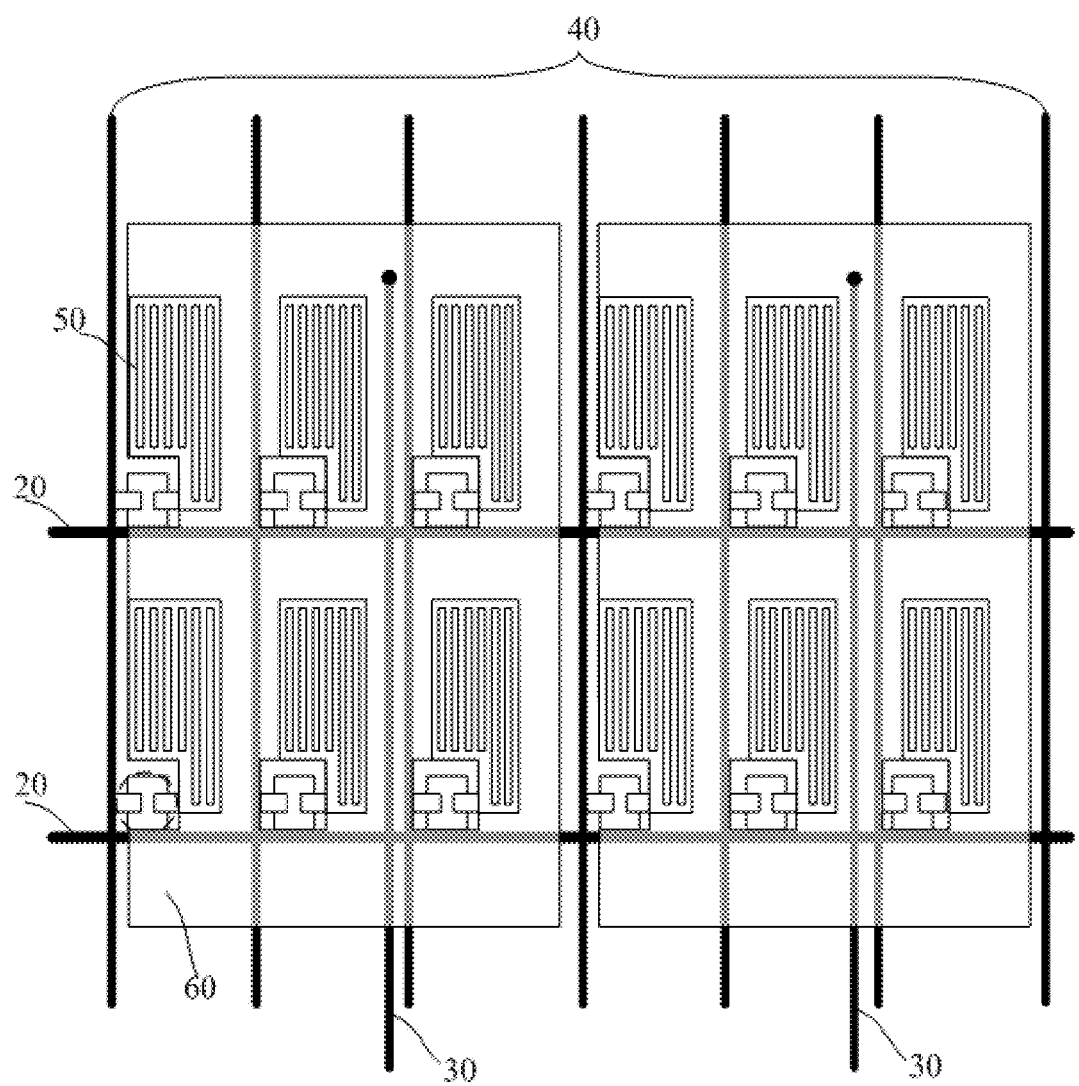
FIG. 8 is a schematic top view of an array substrate according to an embodiment of the present disclosure.

In one or more embodiments, as shown in FIG. 8, the array substrate further comprises touch electrodes 60 which are electrically connected with the touch electrode signal lines 30. The touch electrodes 60 are multiplexed as common electrodes.

As for each of the touch electrodes 60, one of the touch electrode signal lines 30 is electrically connected thereto. Namely, the touch electrodes 60 are electrically connected with the touch electrode signal lines 30 in a one-to-one correspondence.

The touch electrodes 60 are multiplexed as common electrodes. For example, in the display phase, a common voltage is supplied to the touch electrodes 60, so that touch electrodes 60 function as common electrodes. In the touch phase, the touch driving signal is supplied to the touch electrodes 60. When the array substrate is applied to a display device, the touch function is implemented based on the self-capacitance manner.

In an exemplary embodiment, the shape of the touch electrodes 60 is a rectangle.

As shown in FIG. 8, for example, the first signal lines 20 are gate lines, and the second signal lines 40 are data lines. In an exemplary embodiment, the array substrate further comprises thin film transistors, each of which comprises a gate, a gate insulating layer, an active layer, a source, and a drain. The drain is electrically connected with the pixel electrodes 50, the source is electrically connected with the data lines, and the gate is electrically connected with the gate lines.

On one hand, since the touch electrodes 60 are multiplexed as common electrodes, the array substrate has a higher level of integration and is thinner, and the number of the patterning processes does not increase. On the other hand, the touch and display driver integration (TDDI) technique may be used for display and touch, and this may reduce the number of ICs. On the other hand, when the touch electrodes 60 are used as common electrodes, liquid crystal deflection may be driven based on advanced super dimensional switching (ADS) technique, thereby making the display device to which the array substrate is applied has high resolution, high transmittance, low power consumption, wide viewing angle, high aperture ratio, low chromatic aberration, no water ripples upon pressing, etc.

Embodiments of the present disclosure further provide a display panel comprising the above array substrate. The display panel has the same beneficial effects as the array substrate, which are not repeated for simplicity.

In one or more embodiments, the display panel further comprises a pressure detecting structure.

The pressure detecting structure may comprise a plurality of pressure detecting electrodes, and the pressure detecting electrodes are arranged on the array substrate. To avoid affecting the display and touch function, the pressure detecting electrodes may be arranged on a side of the pixel electrodes and the touch electrodes close to the backlight module. Based on this, the detection of the pressure value may be performed based on the change in the distance between the pressure detecting electrodes and the metal back plate in the backlight module upon pressure.

Figure 9:
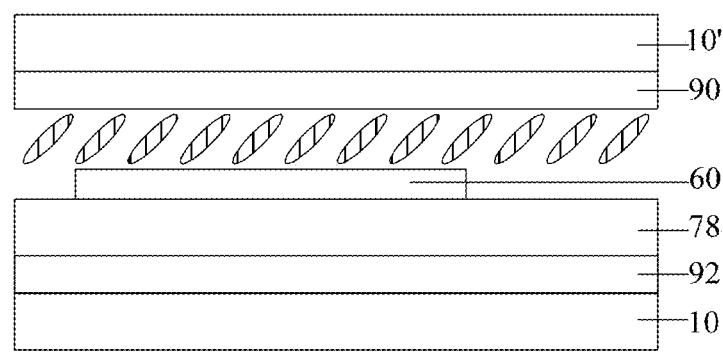
FIG. 9 is a schematic structural diagram of a display panel according to an embodiment of the present disclosure.

In an exemplary embodiment, the pressure detecting structure comprises a plurality of first pressure detecting electrodes 90 and a plurality of second pressure detecting electrodes 92. As shown in FIG. 9, the first pressure detecting electrodes 90 are arranged on a substrate 10' of a counter substrate to be assembled with the array substrate, and the second pressure detecting electrodes 92 are arranged on the substrate 10 of the array substrate. The second pressure detecting electrodes 92 are arranged on a side of the touch electrodes 60 close to the backlight module (which is arranged below the substrate 10 in FIG. 9) and are insulated from the touch electrodes 60 by the insulating layer 78.

In an exemplary embodiment, the touch electrodes 60 are multiplexed as the second pressure detecting electrodes 92.

According to this embodiment, the detection of the pressure value is performed based on the change in the distance between the first pressure detecting electrodes 90 and the second pressure detecting electrodes 92 upon pressure. By providing the pressure detection structure, the pressure detection function may be realized to improve user experience.

An embodiment of the present disclosure further provides a method for fabricating an array substrate. As shown in FIG. 1 and FIG. 2, the method comprises: forming first signal lines 20 and touch electrode signal lines 30 on the substrate 10, wherein the touch electrode signal lines 30 are arranged to intersect with the first signal lines 20; each of the touch electrode signal lines 30 comprises a plurality of first sub-signal lines 301 and a plurality of second sub-signal lines 302; the first sub-signal lines 301 and the first signal lines 20 are formed in a same patterning process and are insulated from the first signal lines 20; each of the second sub-signal lines 302 runs across one of the first signal lines and is electrically connected with the first sub-signal lines 301 adjacent to said second sub-signal lines 302 through vias; the second sub-signal lines 302 are formed by a patterning process different from the first sub-signal lines 301.

It should be understood by those skilled in the art that in case the array substrate is applied to a display device, the array substrate comprises at least two kinds of signal lines which intersect with one another, so as to display normally. That is, in addition to the first signal lines 20, the array substrate at least further comprise second signal lines 40 intersecting with the first signal lines 20.

Since the touch electrode signal lines 30 are arranged to intersect with the first signal lines 20, the touch electrode signal lines 30 are close to the second signal lines intersecting with the first signal lines 20, without affecting the display.

Based on this, those skilled in the art should understand that the touch electrode signal lines 30, the first signal lines 20, and the second signal lines 40 intersecting with the first signal lines 20 are used for different functions. Thus, the signal lines should be insulated from each other.

An embodiment of the present disclosure provides a method for fabricating an array substrate. By dividing the touch electrode signal lines 30 into a plurality of first sub-signal lines 301 and a plurality of second sub-signal lines 302, the first sub-signal lines 301 are arranged in a same layer as the first signal lines 20, and each of the second sub-signal lines 302 runs across one of the first signal lines 20 and is electrically connected with the first sub-signal lines 301 adjacent to said second sub-signal lines 302 through vias. Based on the design of the first sub-signal lines 301 of the touch electrode signal lines 30, even in case the second sub-signal lines 302 and the second signal lines intersecting with the first signal lines 20 are formed in a same patterning process, the influence of the signal on the control electrode signal lines 30 on the second signal lines intersecting with the first signal lines 20 may be greatly improved, and the risk of a short circuit between the touch electrode signal lines 30 and the second signal lines 40 intersecting with the first signal lines 20 due to the introduction of foreign matter in the process may also be greatly reduced.

In one or more embodiments, as shown in FIGS. 3, 4 and 5, the second signal lines are arranged to intersect with the first signal lines 20 and are insulated from the touch electrode signal lines 30. The second sub-signal lines 302 of the touch electrode signal lines 30 and the second signal lines 40 are formed in a same patterning process.

The touch electrode signal lines 30 and the second signal lines 40 may be arranged in parallel.

In order to minimize the influence on aperture ratio and avoid the short circuit between the second signal lines 40 and the touch electrode signal lines 30, the distance between the second signal lines 40 and the touch electrode signal lines 30 may be set to about 3-5 μm.

On one hand, by arranging the second sub-signal lines 302 of the touch electrode signal lines 30 and the second signal lines 40 in a same layer, the touch electrode signal lines 30 may be formed without any further patterning process, thereby saving cost. On the other hand, the signal lines are generally made of a low-resistance metal material to avoid large resistance which would affect the signal transmission quality. Therefore, by forming the second sub-signal lines 302 and the second signal lines 40 in a same patterning process, both the second sub-signal lines 302 and the first sub-signal lines 301 are made from a metal, it is ensured that the touch electrode signal lines 30 has low resistance.

In one or more embodiments, one of the first signal lines 20 and the second signal lines 40 are gate lines, and the other are data lines.

In one or more embodiments, as shown in FIGS. 6 and 7, the method further comprises forming pixel electrodes 50; the second sub-signal lines 302 and the pixel electrodes 50 being formed in a same patterning process.

In contrast with the first sub-signal lines 301 and the second sub-signal lines 302 which are made from a metal, the second sub-signal lines 302 are made from a transparent conductive material. Although there is certain influence on the overall resistance of the touch electrode signal lines 30, the second sub-signal lines 302 is short, so that the influence is small. And the transmission quality of the signal on the touch electrode signal lines 30 may be ensured. On this basis, since the second sub-signal lines 302 and the second signal lines 40 of the first signal lines 20 are formed in different patterning processes, the influence of the signal on the touch electrode signal lines 30 on the second signal lines 40 may be completely avoided, and the problem that the touch electrode signal lines 30 and the second signal lines 40 are short-circuited due to the introduction of foreign matter in the process is completely avoided.

In one or more embodiments, as shown in FIG. 8, the method for fabricating the array substrate further comprises: forming touch electrodes 60, wherein the touch electrodes 60 are electrically connected with the touch electrode signal lines 30. The touch electrodes 60 are multiplexed as common electrodes. This makes the array substrate have higher integration degree, thinner thickness, and does not increase the number of patterning process.

Embodiments of the present disclosure provide an array substrate, a method for fabricating the same and a display panel. By dividing the touch electrode signal lines into a plurality of first sub-signal lines and a plurality of second sub-signal lines, the first sub-signal lines are arranged in a same layer as the first signal lines and is insulated from the first signal lines, and each of the second sub-signal lines runs across one of the first signal lines and is electrically connected with the first sub-signal lines adjacent to said second sub-signal line through vias. Based on the design of the first sub-signal lines of the touch electrode signal lines, even in case the second sub-signal lines and the second signal lines intersecting with the first signal lines are arranged in a same layer, the influence of the signal on the control electrode signal lines on the second signal lines intersecting with the first signal lines may be greatly reduced, and the risk of a short circuit between the touch electrode signal lines and the other signal lines intersecting with the first signal lines due to the introduction of foreign matter in the process may also be greatly reduced.

The above embodiments are only used for explanations rather than limitations to the present disclosure, the skilled in the art, in the case of not departing from the spirit and scope of the present disclosure, may also make various modifications and variations, therefore, all the equivalent solutions also belong to the scope of the present disclosure, the patent protection scope of the present disclosure should be defined by the claims.

The invention claimed is:

1. An array substrate, comprising:
   a substrate;
   first signal lines on the substrate;
   second signal lines on the substrate; and
   touch electrode signal lines on the substrate,
   wherein the touch electrode signal lines intersect the first signal lines,
   wherein each of the touch electrode signal lines is consisting of a plurality of first sub-signal lines and a plurality of second sub-signal lines,
   wherein the first sub-signal lines are in a same layer as and insulated from the first signal lines,
   wherein ones of the second sub-signal lines run across corresponding ones of the first signal lines and are electrically connected by corresponding vias to one or more of the first sub-signal lines that are adjacent to the ones of the second sub-signal lines,
   wherein the second signal lines intersect the first signal lines and are insulated from the touch electrode signal lines,
   wherein the first sub-signal lines are in a different layer from the second sub-signal lines,
   wherein in each of the touch electrode signal lines, an orthographic projection of one of the plurality of first sub-signal lines on the substrate is a first straight line, an orthographic projection of one of the plurality of second sub-signal lines is a second straight line, and the first straight line is parallel to the second straight line, and
   wherein the touch electrode signal lines are in parallel with the second signal lines.

2. The array substrate according to claim 1, wherein in an extending direction of the touch electrode signal lines, a distance between either end of an orthographic projection of each of the second sub-signal lines on the substrate and an orthographic projection of each of the first signal lines on the substrate is about 3-5 μm.

3. The array substrate according to claim 1, wherein the second sub-signal lines of the touch electrode signal lines are in a same layer as the second signal lines.

4. The array substrate according to claim 1, wherein one of the first signal lines or the second signal lines comprise gate lines and remaining ones of the first signal lines or the second signal lines comprise data lines.

5. The array substrate according to claim 4, wherein the first signal lines comprise gate lines, and the second signal lines comprise data lines.

6. The array substrate according to claim 1, further comprising:
   pixel electrodes,
   wherein the second sub-signal lines are in a same layer as the pixel electrodes.

7. The array substrate according to claim 1, further comprising:
   touch electrodes which are electrically connected with the touch electrode signal lines.

8. The array substrate according to claim 7, wherein the touch electrodes are multiplexed as common electrodes.

9. A display panel, comprising the array substrate of claim 1.

10. The display panel according to claim 9, further comprising:
    a pressure detecting structure,
    wherein the pressure detecting structure comprises a plurality of first pressure detecting electrodes and a plurality of second pressure detecting electrodes,
    wherein the first pressure detecting electrodes are on a substrate of a counter substrate to be assembled with the array substrate, and
    wherein the second pressure detecting electrodes are on the substrate of the array substrate.

11. The display panel according to claim 10, wherein the second pressure detecting electrodes are on a side of pixel electrodes close to a backlight module and are insulated from the pixel electrodes.

12. The display panel according to claim 10, wherein the second pressure detecting electrodes are on a side of the touch electrodes close to a backlight module and are insulated from the touch electrodes.

13. The display panel according to claim 10, wherein the touch electrodes are multiplexed as the second pressure detecting electrodes.

14. A method for fabricating an array substrate, the array substrate comprising a substrate, and the method comprising:
    forming first signal lines and touch electrode signal lines on the substrate, wherein the touch electrode signal lines intersect the first signal lines; and
    forming second signal lines that intersect the first signal lines and are insulated from the touch electrode signal lines,
    wherein each of the touch electrode signal lines is consisting of a plurality of first sub-signal lines and a plurality of second sub-signal lines,
    wherein the first sub-signal lines and the first signal lines are formed in a same patterning process, so that the first sub-signal lines are in a same layer as and insulated from the first signal lines,
    wherein ones of the second sub-signal lines run across corresponding ones of the first signal lines and are electrically connected by corresponding vias to one or more of the first sub-signal lines that are adjacent to the ones of the second sub-signal lines, wherein the second sub-signal lines are formed by a patterning process different from the first sub-signal lines, so that the first sub-signal lines are in a different layer from the second sub-signal lines, wherein in each of the touch electrode signal lines, an orthographic projection of one of the plurality of first sub-signal lines on the substrate is a first straight line, an orthographic projection of one of the plurality of second sub-signal lines is a second straight line, and the first straight line is parallel to the second straight line, and wherein the touch electrode signal lines are in parallel with the second signal lines.

15. The fabrication method according to claim 14, further comprising:

forming second signal lines which intersect the first signal lines and are insulated from the touch electrode signal lines, wherein the second sub-signal lines of the touch electrode signal lines are formed in a same patterning process as the second signal lines.

16. The fabrication method according to claim 15, wherein one of the first signal lines or the second signal lines comprise gate lines and remaining ones of the first signal lines or the second signal lines comprise data lines.

17. The fabrication method according to claim 15, further comprising:

forming pixel electrodes, wherein the second sub-signal lines are formed in a same patterning process as the pixel electrodes.

* * * * *